United States Patent
Yang et al.

(10) Patent No.: US 8,541,862 B2
(45) Date of Patent: Sep. 24, 2013

(54) SEMICONDUCTOR DEVICE WITH SELF-BIASED ISOLATION

(75) Inventors: Hongning Yang, Chandler, AZ (US); Jiang-Kai Zuo, Chandler, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 85 days.

(21) Appl. No.: 13/307,449

(22) Filed: Nov. 30, 2011

(65) Prior Publication Data
US 2013/0134511 A1 May 30, 2013

(51) Int. Cl.
*H01L 29/66* (2006.01)
(52) U.S. Cl.
USPC ............... 257/492; 257/493; 257/E29.014
(58) Field of Classification Search
USPC .................... 257/492, 493, E29.014
See application file for complete search history.

(56) References Cited

U.S. PATENT DOCUMENTS

| | | | | |
|---|---|---|---|---|
| 4,862,242 | A * | 8/1989 | Wildi et al. | 257/492 |
| 5,883,413 | A * | 3/1999 | Ludikhuize | 257/343 |
| 6,882,023 | B2 * | 4/2005 | Khemka et al. | 257/493 |
| 7,579,632 | B2 * | 8/2009 | Salih et al. | 257/173 |
| 7,608,513 | B2 * | 10/2009 | Yang et al. | 438/286 |
| 7,629,631 | B2 * | 12/2009 | Yilmaz | 257/260 |
| 7,795,674 | B2 * | 9/2010 | Yang et al. | 257/336 |
| 2003/0214009 | A1 * | 11/2003 | Parthasarathy et al. | 257/492 |
| 2004/0145027 | A1 * | 7/2004 | Nitta et al. | 257/492 |
| 2007/0052058 | A1 * | 3/2007 | Hirler et al. | 257/492 |

OTHER PUBLICATIONS

V. Khemka et al., "Novel FRESURF LDMOSFET Devices with Improved $BV_{dss}$-$R_{dson}$," IEEE Electron Device Letters, vol. 25, No. 12, pp. 804-806, Dec. 2004.
V. Khemka et al., "Floating RESURF (FRESURF) LDMOSFET Devices with Breakthrough $BV_{dss}$-$R_{dson}$ (for example: 47V—0.28mΩ.cm$^2$ or 93V—0.82 mΩ.cm$^2$," Proceedings of 2004 International Symposium on Power Semiconductor Devices & ICs, Kitakyushu, vol. 8, No. 1, pp. 415-418, 2004.
V. Khemka et al., "A Floating RESURF (RESURF) LD-MOSFET Device Concept," IEEE Electron Device Letters, vol. 24, No. 10, pp. 664-666, Oct. 2003.

* cited by examiner

*Primary Examiner* — Lex Malsawma
(74) *Attorney, Agent, or Firm* — Lempia Summerfield Katz LLC

(57) ABSTRACT

A device includes a semiconductor substrate including a surface, a drain region in the semiconductor substrate having a first conductivity type, a well region in the semiconductor substrate on which the drain region is disposed, the well region having the first conductivity type, a buried isolation layer in the semiconductor substrate extending across the well region, the buried isolation layer having the first conductivity type, a reduced surface field (RESURF) region disposed between the well region and the buried isolation layer, the RESURF region having a second conductivity type, and a plug region in the semiconductor substrate extending from the surface of the substrate to the RESURF region, the plug region having the second conductivity type.

16 Claims, 5 Drawing Sheets

SEMICONDUCTOR DEVICE WITH SELF-BIASED ISOLATION

FIELD OF INVENTION

The present embodiments relate to semiconductor devices.

BACKGROUND

Integrated circuits (ICs) and other electronic devices often include arrangements of interconnected field effect transistors (FETs), also called metal-oxide-semiconductor field effect transistors (MOSFETs), or simply MOS transistors or devices. A typical MOS transistor includes a gate electrode as a control electrode and spaced apart source and drain electrodes. A control voltage applied to the gate electrode controls the flow of current through a controllable conductive channel between the source and drain electrodes.

Power transistor devices are designed to be tolerant of the high currents and voltages that are present in power applications such as motion control, air bag deployment, and automotive fuel injector drivers. One type of power MOS transistor is a laterally diffused metal-oxide-semiconductor (LDMOS) transistor. In an LDMOS device, a drift space is provided between the channel region and the drain region.

LDMOS devices may be designed to operate in a high-side configuration in which all of the device terminals are level shifted with respect to the substrate potential. Devices configured for high-side operation have been applied in power switchers in DC-to-DC converters, which have respective LDMOS devices for the high side and low side. High-side capable devices may be designed to prevent a direct punch-through path from a body region of the LDMOS device to an underlying, heavily doped substrate.

LDMOS devices are often used in applications, such as automotive applications, involving operational voltages greater than 45 Volts. Breakdown resulting from applying such high voltages to the drain is often prevented through a reduced surface field (RESURF) structure of the LDMOS device design. The RESURF structure is designed to deplete the drift space of the LDMOS device in both vertical and lateral directions, thereby reducing the electric field in the PN junctions surrounding the drift region and thus raising the breakdown voltage (BVDSS) of the device. Some LDMOS devices have a "double RESURF" structure, in which the drift space contains both n-type and p-type regions. The double nature of the structure refers to the depletion of the two regions and the reduction of the electric field in the related junction areas. Double RESURF structures typically apply the drain voltage to isolation regions in order to deplete the both the n-type and p-type regions. However, biasing the isolation regions at the drain voltage increases the field stress between the source of the LDMOS device and a buried isolation layer. Breakdown may instead occur between the source and the buried isolation layer, thereby limiting the breakdown voltage. Efforts to address such source-based breakdown using a lightly doped buried isolation layer have increased substrate injection and compromised electrostatic discharge (ESD) performance.

BRIEF DESCRIPTION OF THE DRAWINGS

The components and the figures are not necessarily to scale, emphasis instead being placed upon illustrating the principles of the invention. Moreover, in the figures, like reference numerals designate corresponding parts throughout the different views.

DETAILED DESCRIPTION OF THE PRESENTLY PREFERRED EMBODIMENTS

Figure 1:
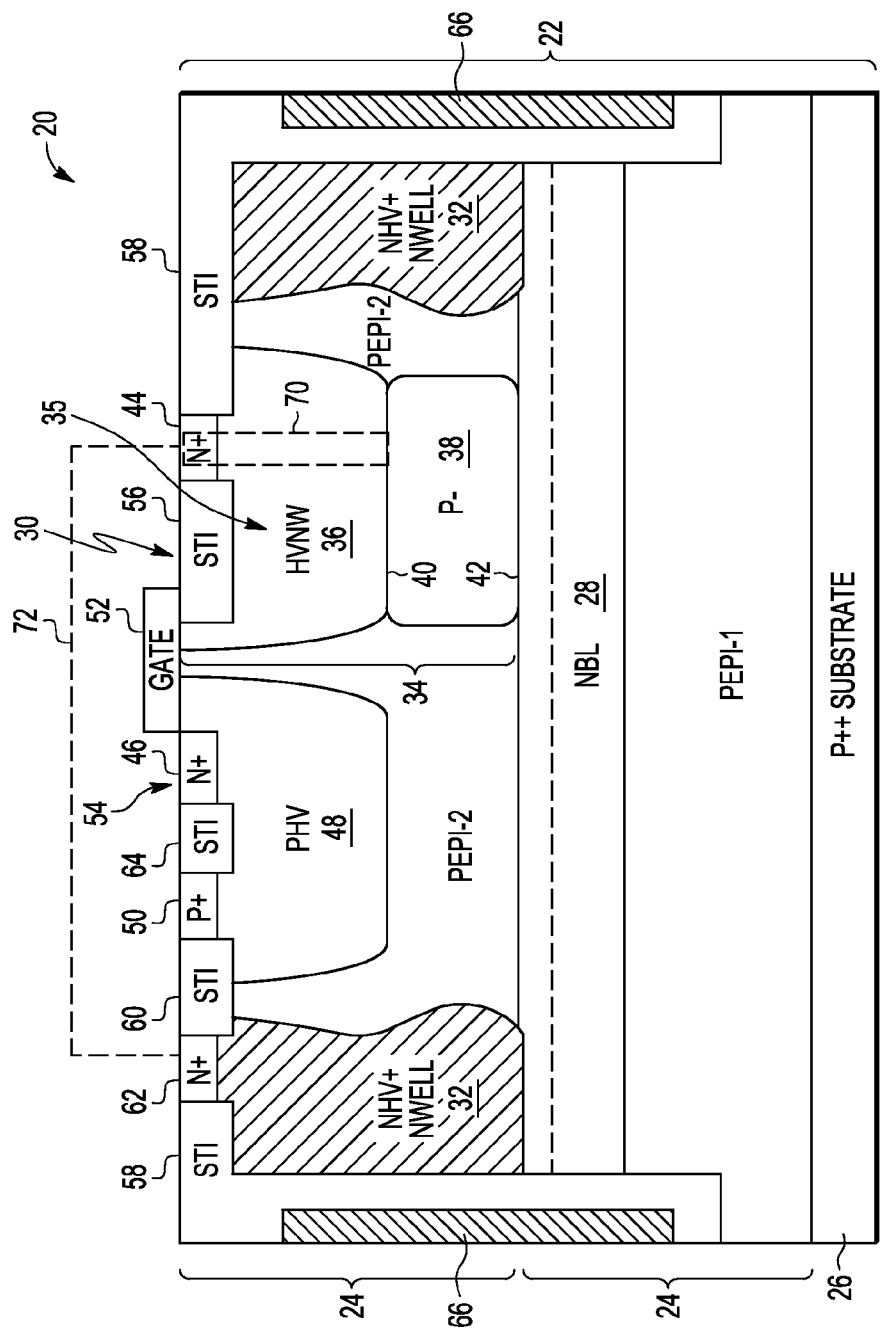
FIG. 1 is a cross-sectional, schematic view of an n-channel field LDMOS transistor with self-biased isolation via a p-well plug in accordance with one embodiment.

LDMOS and other transistor devices and electronic apparatus are configured with a structural arrangement that establishes self-biased RESURF isolation. The disclosed devices may be field drift devices, and the structural arrangement may be disposed in the drift space. The disclosed devices can remain fully isolated despite not using the drain voltage directly to establish the RESURF isolation. The isolation may be optimized or customized to raise the breakdown voltage of the device or apparatus (e.g., beyond 60V) without detrimentally affecting other device parameters, such as breakdown between the source and a buried isolation layer. The resulting breakdown voltage of the disclosed devices may exceed the device operational voltage by 15-20V or more. The disclosed devices may thus be used in a variety of high voltage power switching applications, including automotive and consumer applications, which may benefit from breakdown voltages of, for instance, 80, 105, or 125V.

In one aspect, the disclosed devices establish an asymmetric double RESURF effect in a drift region. The structural arrangement of the disclosed devices may be used to avoid biasing one or more device isolation regions at the drain voltage to reduce the electric field in a drift region. The structural arrangement is configured to instead establish a voltage to bias one or more device isolation regions at a level lower than the drain voltage (e.g., 30-50% lower than the drain voltage). The lower voltage thus reduces the electric field stress between the source and the device isolation region (s). For example, a buried isolation or barrier layer extending across the active region of the device may be biased by the lower voltage. The isolation region(s) may be considered to be self-biased, insofar as, for example, the lower voltage is applied to the isolation region(s) via the structural arrangement of the disclosed devices. The resulting RESURF effect may be asymmetric due to the lower voltage presented from one direction by the isolation region(s) for depletion of a RESURF region.

In some embodiments, the lower isolation bias voltage and the asymmetric double RESURF effect are established via one or more plugs positioned to extend from a substrate surface or a drain region of a first semiconductor conductivity type to a region of a second semiconductor conductivity type disposed in the drift space of the disclosed devices. For example, the plug(s) may be disposed adjacent a top surface of the drain region having the first semiconductor conductivity type and extend into the drift region to link to a top surface of the region having the second semiconductor conductivity type. The plug(s) are thus biased at a voltage that corresponds with, or is based on, the voltage at the top surface of the region having the second semiconductor conductivity type. The plug (s), in turn, may be shorted or otherwise electrically tied to one or more isolation regions of the disclosed devices. The isolation region(s) may include a buried barrier layer, which is consequently biased at the voltage of the plug(s).

The plug(s) may be formed in conjunction with formation of a well having the second semiconductor conductivity type (e.g., a p-type well), which may correspond with a body region of the disclosed devices. For example, the same fabrication act that forms the body region may also form the plug(s).

In another aspect, one or more characteristics of the plug(s) may be selected to customize the voltage established for the isolation region(s). For example, the size of the plug(s) may be selected to customize the voltage reached in the plug and, thus, the isolation bias voltage. Alternatively or additionally, the spacing between adjacent plugs may be selected to customize the isolation bias voltage. The disclosed devices may be configured such that the isolation region(s) may reach a voltage in a range from about 50% to about 80% of the drain voltage. Such an offset from the drain voltage raises the breakdown voltage via an enhanced, asymmetric, double RESURF effect, as described below.

Although described below in connection with n-channel field LDMOS transistors, the disclosed devices are not limited to any particular transistor configuration. For instance, application of the features of the disclosed devices is not limited to LDMOS or other power MOS devices. One or more features of the disclosed devices may be applied to other device configurations, including, for instance, bipolar transistors. For example, the plug(s) and other structural arrangements may be useful in a wide variety of power electronic devices. The structural arrangements are also not limited to any one particular type of RESURF configuration. The disclosed devices may have varying RESURF structures, including single, double, or other RESURF structural arrangements, each of which may be referred to herein as a "RESURF transistor."

For convenience of description and without any intended limitation, n-channel LDMOS devices are described and illustrated herein. The disclosed devices are not limited to n-channel devices, as p-channel and other types of devices may be provided by, for example, substitution of semiconductor regions of opposite conductivity type. Thus, for example, each semiconductor region, layer or other structure in the examples described below may have a conductivity type (e.g., n-type or p-type) opposite to the type identified in the examples below.

FIG. 1 is a schematic cross-sectional view of an example of an n-channel field LDMOS device 20 constructed in accordance with one embodiment. The device 20 is configured as a RESURF transistor as described below. The device 20 includes a semiconductor substrate 22, which may, in turn, include a number of epitaxial layers 24. In this example, the semiconductor substrate 22 includes two p-type epitaxial layers Pepi-1 and Pepi-2 grown on an original substrate 26 (e.g., a heavily doped p-type substrate). The device 20 may alternatively or additionally include non-epitaxial layers in which one or more device regions are formed. The structural, material, and other characteristics of the semiconductor substrate 22 may vary from the example shown, and may include, for instance, one or more semiconductor and/or non-semiconductor layers, a silicon-on-insulator (SOI) construction, etc.

The disclosed devices are not limited to, for instance, bulk silicon substrates, and instead may be supported by and/or include SOI and other semiconductor substrates. The semiconductor substrate 22 includes an N-type buried layer (NBL) 28, which may be formed in one or both of the epitaxial layers 24 thereof. The NBL 28 extends across (e.g., under) an active area 30 of the device 20 to act as a barrier or isolation layer separating the active area 30 from the rest of the substrate (e.g., the original substrate 26). The NBL 28 may constitute one of several device isolation regions surrounding the active area 30 of the device 20. In this example, the device 20 also includes a heavily doped n-type isolation well or sink 32 laterally surrounding the active area 30. The isolation well or sink 32 may be disposed on or otherwise above the NBL 28. The isolation well or sink 32 may be connected to the NBL 28 outside of the periphery of the active area 30 as shown. In this example, the device isolation well or sink 32 may be configured for high voltage (HV) operation, including punch-through prevention, via, for instance, a high dopant concentration (NHV+NWELL).

The device 20 includes a well region 34 in the substrate 22 located inside the active area 30 and formed, in this example, in the epitaxial layer Pepi-2. The well region 34 may correspond with a drift region or space 35 of the device 20 disposed on or otherwise above the NBL 28. The well region 34 is configured for depletion, at least in part, during operation to establish the RESURF effect for improved breakdown performance. In this example, the well region 34 is configured to achieve a double RESURF effect. The well region 34 includes an n-type well region portion 36 and a p-type well region portion 38 disposed between the n-type well region portion 36 and the NBL 28. The p-type well region portion 38 may be disposed on or otherwise above the NBL 28, and the n-type well region portion 36 may be disposed on or otherwise above the p-type well region portion 38. The n-type well region portion 36 may be configured as a high voltage n-type well (NVNW), and the p-type well region portion 38 may be formed by p-type doping the NVNW region portion 36 of the well 34 to attain a light p-type concentration (P−).

One or both of the well region portions 36 and 38 may be depleted, at least in part, and, thus, act as RESURF regions during operation. For example, the p-type well region portion 38 may be depleted at a reverse-biased junction 40 with the n-type well region portion 36 and at a reverse-biased junction 42 with the NBL 28, which extends across the well region 34 as shown. The junctions 40, 42 are reverse-biased as a result of the application of a drain voltage Vd to a heavily n-type drain region 44 disposed on the well region 34. Further details regarding the structural and operational characteristics of these RESURF regions are set forth in U.S. Pat. No. 6,882,023 ("Floating RESURF LSMOSFET and Method of Manufacturing Same").

The drain region 44 may be disposed on or otherwise above the well region 34 and, more specifically, the n-type well region portion 36. In a typical LDMOS configuration, the drain region 44 is biased at a high voltage relative to a heavily doped n-type source region 46, which may, for example, be considered to be at ground potential. The source region 46 may be formed on a p-type device body or body region 48, which may, in turn, include a p-type well formed in the epitaxial layer Pepi-2 of the substrate 22. The body region 48 may be spaced from the well region 34 by a portion of the drift region 35 as shown, including any RESURF regions thereof (e.g., the p-type well region portion 38). The body region 48 may be biased via a heavily doped p-type body contact region 50 formed on or otherwise above the p-type well of the body region 48.

The device 20 includes a gate structure 52 formed on a surface 54 of the substrate 22. The gate structure 52 is located on a gate dielectric (not shown), e.g., silicon dioxide (or oxide) deposited or otherwise formed on the surface 54. The gate structure 52 includes a conductive gate on or otherwise above the gate dielectric 34, which insulates the conductive gate from the substrate 22. The gate structure 52 may be further spaced from the active region 30 of the device 20, including, for instance, the high voltage applied to the drain region 44, via one or more shallow trench isolation (STI) regions 56 formed at the surface 54 of the substrate 22. The gate structure 52 extends laterally between the source region 46 and the drift region or space established by, for instance, the n-type well 34. In this example, the gate structure 52 overlaps a portion of the n-type well 34.

The components, materials, and other characteristics of the gate structure 52 may vary from the example shown. For instance, the gate structure 52 may include one or more additional conductive gates to form, for instance, a dual-gate device. Further details regarding examples of dual-gate structures are described in U.S. Pat. No. 7,608,513 ("Dual Gate LDMOS Device Fabrication Methods") and U.S. Pat. No. 7,795,674 ("Dual Gate LDMOS Devices"). One or more dielectric spacers (e.g., sidewall spacers) may cover lateral edges of the gate structure 52. One or more of the spacers (not shown) may be configured as a silicide blocker to prevent a silicide short along the surface 54. One or more intermediately doped n-type diffused regions may alternatively or additionally be formed at the surface 54. For example, one such region may extend from the source region 46 under the edge of gate structure 52 to insure that a high resistance region does not exist between the source region 46 and the channel formed in the P-type well 48 through which flows source-drain current Id during operation. Another such region may extend from the drain region 44 toward the gate structure 52 to assist in controlling the electric field near the drain region 44.

The device 20 may include one or more additional isolation regions or layers. For example, the p-type epitaxial layer Pepi-1 may be configured as a p-type barrier layer similar to the NBL 28. STI region(s) 58 may be formed adjacent to the n-type isolation wells 32 to isolate the active region 30. A further STI region 60 may be formed to isolate the body region 48 from an isolation contact region 62 formed on or otherwise above the n-type isolation well 32. Yet another STI region 64 may be formed to isolate the source region 54 and the body contact region 50. Still further device isolation may be provided via one or more isolation trenches (e.g., LOCOS) 66 formed in the substrate 22 along the STI region 58.

The device 20 is shown in simplified form and, thus, FIG. 1 does not show the conductive (e.g., ohmic) contacts and other metal layers configured for electric coupling with the drain region 44, the source region 46, and the gate structure 52. The device 20 may have a number of other structures or components for connectivity, isolation, passivation, and other purposes not shown in FIG. 1 for ease in illustration.

The device 20 includes one or more structures to self-bias one or more isolation regions at an isolation bias voltage lower than the drain voltage Vd. The structures may be configured to couple the isolation regions to a voltage reached within the drift region. In the example shown in FIG. 1, the device 20 includes a plug region 70 in the semiconductor substrate 22 extending from the substrate surface 54 to one or both of the RESURF regions 36, 38 in the drift space 35. The plug region 70 may be disposed adjacent the drain region 44, and extend from an upper surface of the drain region to the RESURF region(s). The plug region 70 has a conductivity type opposite that of the drain region to isolate the plug region from the drain voltage Vd and the resulting high voltage in the n-type well region portion 36 as the plug region 70 extends through the n-type well region portion 36.

Figure 2:
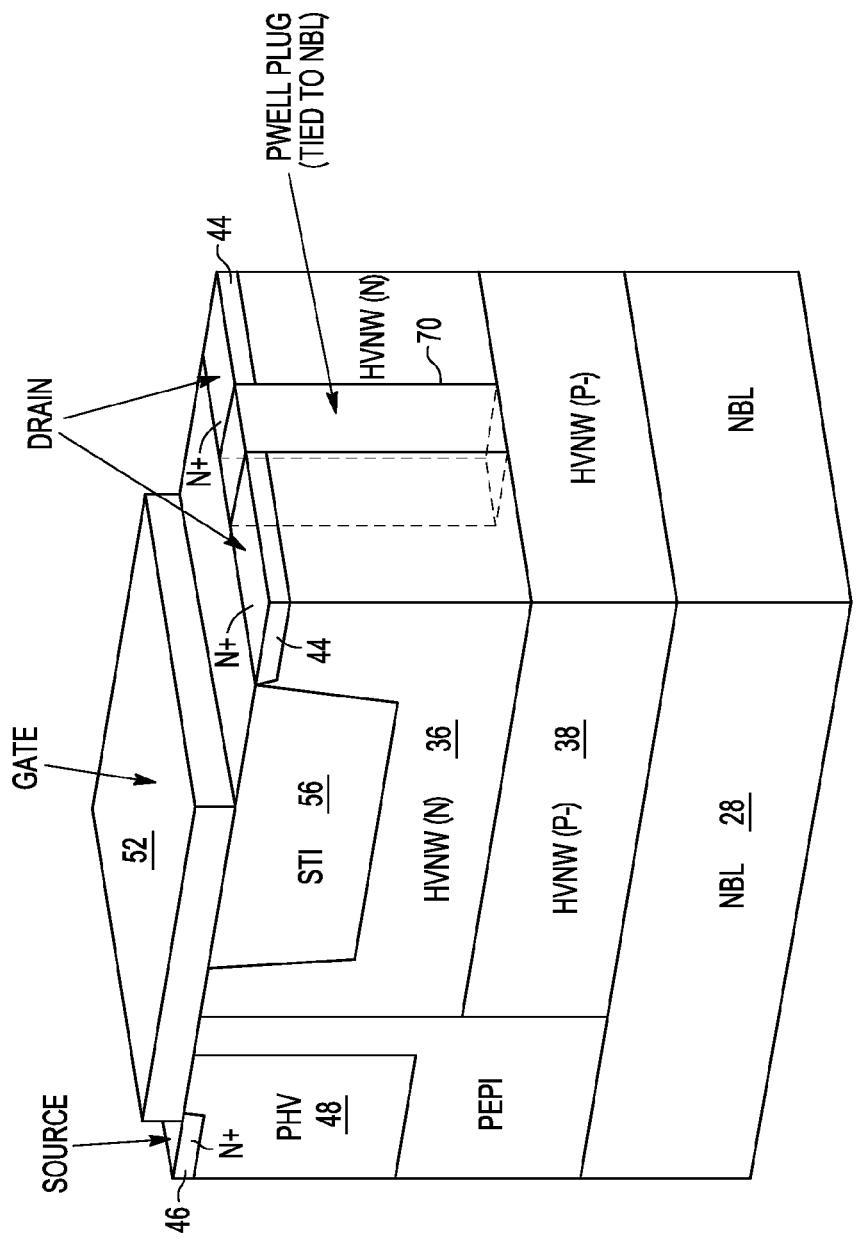
FIG. 2 is a partial, perspective, schematic view of an n-channel field LDMOS transistor with self-biased isolation via a p-well plug in accordance with one embodiment.

As shown in the example shown in FIGS. 1 and 2, the plug region 70 may extend through the n-type well region portion 36 downward to reach or link to an upper surface of the p-type well region portion 38. The plug region 70 thus accesses the voltage present in the depletion region formed between the n-type and p-type well region portions 36, 38. The potential difference across the portion of the depletion region in the n-type well region portion 36 establishes that the voltage accessed by the plug region 70 is lower than the drain voltage Vd. The plug region 70 thus attains a voltage level lower than the drain voltage Vd. The ultimate voltage level of the plug region 70 may be driven by a number of characteristics of the plug region 70, as discussed below.

The plug region 70 is electrically tied or coupled to the isolation well 32, as schematically shown as a dashed line in FIG. 1. The coupling may include a metal line 72. The voltage of the plug region 70 is thus provided to the isolation well 32 to bias the isolation region(s) of the device 20. In this example, the isolation well 32 is connected to the NBL 28, such that the NBL 28 is also biased at the voltage of the plug region 70. This isolation bias voltage leads to a depletion region at the junction 42 between the NBL 28 and the p-type well region portion 38. The resulting RESURF effect is asymmetric because of the different reverse bias voltages applied to the RESURF region. The NBL 28 applies the lower voltage level of the isolation bias voltage established via the plug region 70 from below the RESURF region. In contrast, the drain voltage Vd is applied from above the RESURF region via the n-type well region portion 36.

Figure 3:
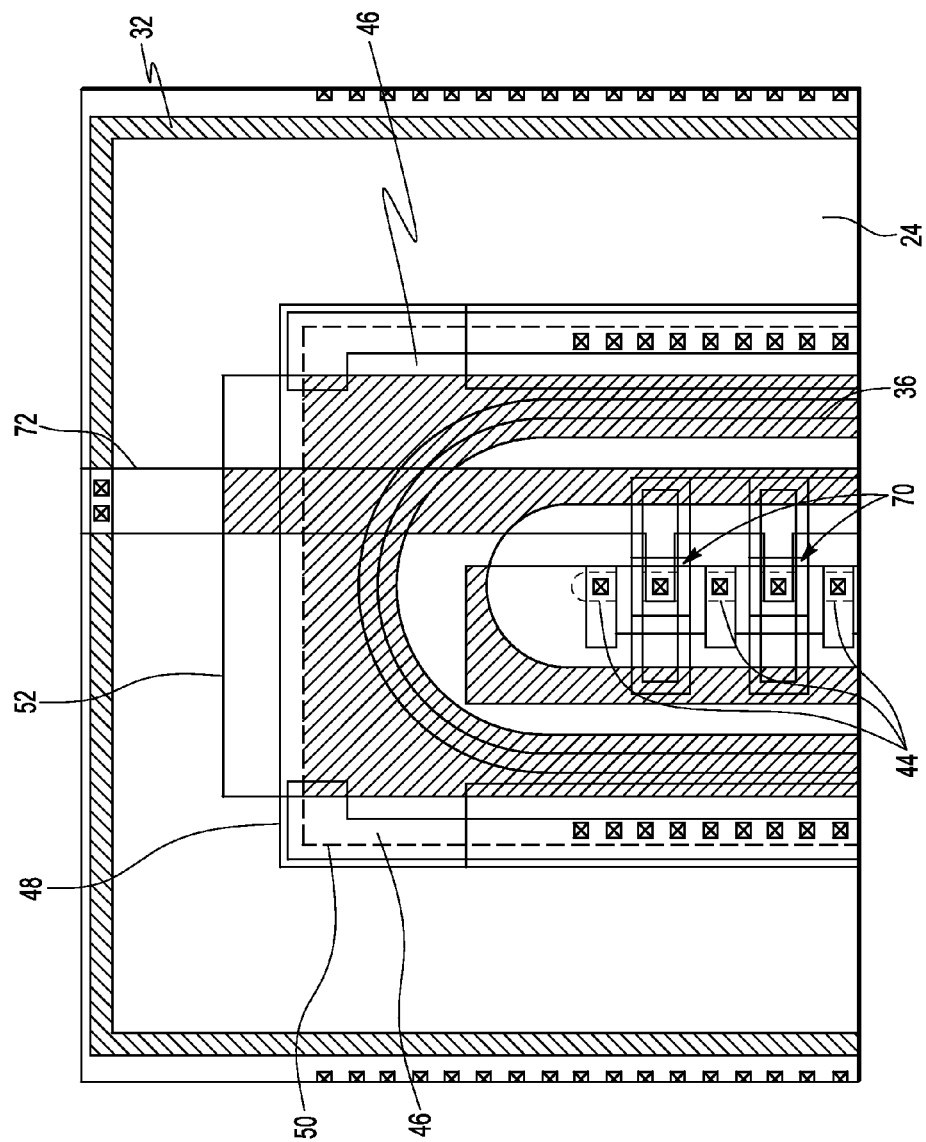
FIG. 3 is a layout view of an example of a transistor having multiple p-well plugs in accordance with one embodiment.

FIGS. 2 and 3, where elements in common with FIG. 1 are shown with common reference numerals, show the plug region 70 in greater detail via perspective and plan views, respectively. FIG. 2 depicts an exemplary positioning of the plug region 70 relative to the drain region 44 in greater detail. In this example, the plug region 70 is disposed between two sections or areas of the drain region 44. The plug region 70 need not be adjacent or contiguous with the drain region 44 as shown, but rather extend from the substrate surface in the general area in which the drain region 44 is disposed. The plug region 70 may be spaced from the drain region 44. In this example, the areas of the drain region 44 are spaced apart from one another by the plug region 70.

The layout view of FIG. 3 depicts how the plug region may include a plurality of plugs 70 spaced from one another by respective portions of the drain region 44. In this example, the plugs 70 and the portions of the drain region 44 are interspersed or disposed in an interdigitated arrangement. The plugs 70 may be disposed in a variety of other arrangements relative to the drain region 44. Each plug 70 is connected to the metal line 72, which, in turn, couples the voltage level attained by the plugs 70 to the isolation well 32 as shown in FIG. 3. As also shown in this example, the metal line 72 may include a plurality of fingers to reach a respective contact for each plug 70, thereby forming a comb-like configuration. A metal line coupled to each drain region 44 may also have a comb-like configuration.

The plug region 70 may be configured to customize the isolation bias voltage. In single plug embodiments, the lateral dimensions of the plug may be configured so that the isolation bias voltage reaches a desired level. In multiple plug embodiments, the spacing between adjacent plugs may additionally or alternatively be used to customize the voltage level. Adjusting the size and/or spacing of the plug(s) allows the isolation bias voltage to be set to a level that falls in a range from about 50% to about 80% of the drain voltage Vd. In one example, the lateral dimensions of the plugs 70 are about 0.85 μm, and the spacing between adjacent plugs 70 is about 2.0 μm. The dimensions and spacing may vary considerably from the example shown in some embodiments.

Figure 4:
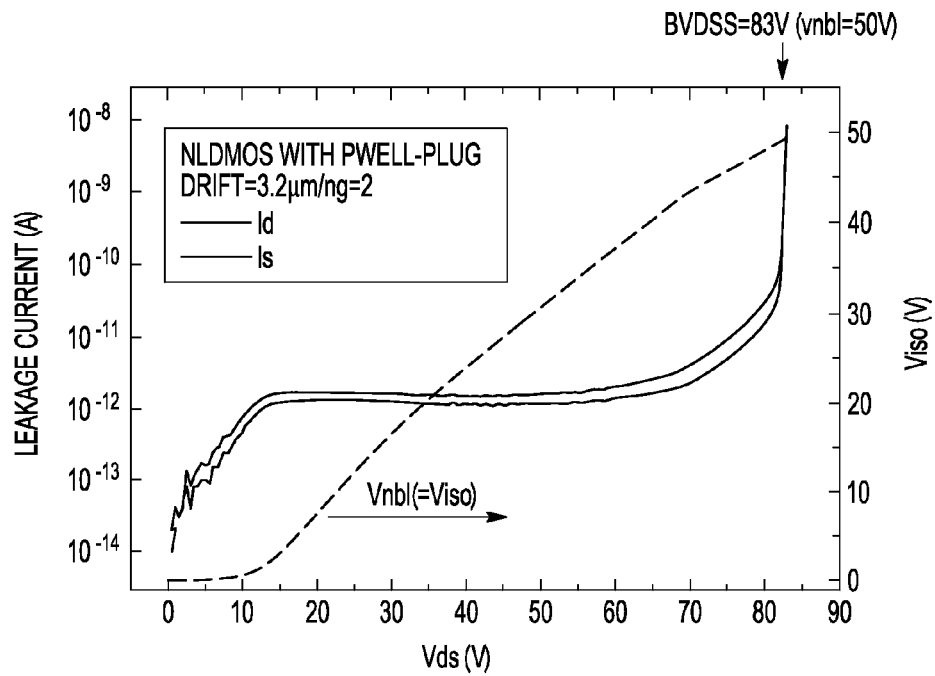
FIG. 4 shows graphical plots of leakage current, breakdown voltage, and isolation voltage data for a transistor configured for self-biased isolation in accordance with one embodiment.

FIG. 4 shows how the voltage level of the upper surface of the p-type portion 38 of the well region 34 is lower than the drain voltage Vd due to the reverse voltage drop across the depleted junction at that surface. The voltage level reached in the plugs is plotted as Viso (i.e., the isolation bias voltage) against the drain voltage Vds. The graph of FIG. 4 also shows how breakdown of the device does not occur until the operational voltage of the device reaches approximately 83V. Near breakdown, the ratio of the isolation bias voltage to the drain voltage is about 0.6. This ratio may be customized or adjusted to optimize the breakdown voltage for a specific device design. The lower isolation bias voltage allows the device to be configured such that breakdown between the source and the isolation region(s) (e.g., the NBL) does not occur any earlier than breakdown involving the drain. In this example, the leakage currents for the source and drain, Is and Id, respectively, begin to sharply increase around the same operational voltage level. The isolation bias voltage and leakage current data depicted in FIG. 4 is based on a dual gate LDMOS device (ng=2) with a drift region length of 3.2 μm. Without the asymmetric double RESURF effect established by the lower isolation bias voltage, breakdown may occur between the source and the NBL at much lower operational voltage (e.g., 54 V).

The breakdown voltage may be raised up to higher levels than shown in the example of FIG. 4. For example, the breakdown voltage may be raised to about 96 V in devices having a longer drift region (e.g., 4 μm), using an isolation bias/drain voltage ratio of 0.5. The asymmetric double RESURF effect resulting from that ratio may be optimized for a given drift length. The optimal ratio may fall in a range from about 0.5-0.7 depending on the drift length. In dual gate LDMOS examples, the breakdown voltage may reach a maximum at or near a ratio of 0.5 for drift lengths of about 2.3 μm and 4.0 μm, and at or near a ratio of about 0.6-0.7 for a drift length of about 1.5 μm.

Figure 5:
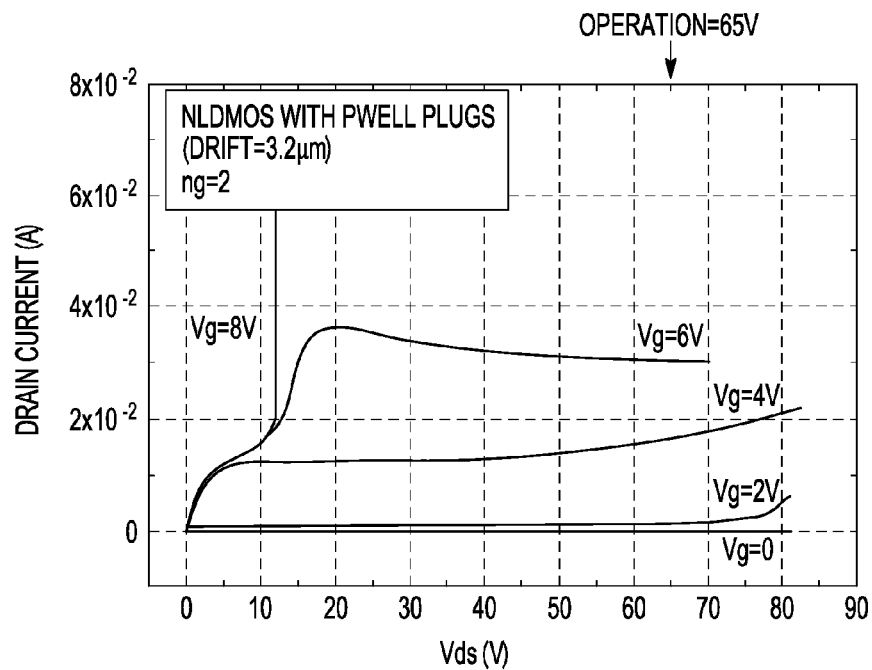
FIG. 5 is a graphical plot of leakage current data for a transistor configured for self-biased isolation in accordance with one embodiment.

FIG. 5 depicts a safe operating area (SOA) curve for an exemplary n-channel LDMOS device having p-type plugs and self-biased isolation as described herein. The device may have an operational voltage of 65 V, with a breakdown voltage at about 83 V. A traditional LDMOS device may, in contrast, have an operational voltage at 45 V, with breakdown at 56 V.

The dopant concentrations, thicknesses, and other characteristics of the above-described semiconductor regions in the substrate 22 may vary. In one example, the above-referenced semiconductor regions may have the following approximate concentrations and thicknesses:

|  | Concentration | Thickness |
| --- | --- | --- |
| substrate 22: | $1 \times 10^{15}/cm^3$ | 10 μm |
| p-epi-1 24: | $1 \times 10^{15}/cm^3$ | 5 μm |
| p-epi-2 24: | $1 \times 10^{15}/cm^3$ | 5 μm |
| original substrate 26: | $1 \times 10^{20}/cm^3$ | varies with Si wafer |
| NBL 28: | $1 \times 10^{18}/cm^3$-$1 \times 10^{19}/cm^3$ | 1.5 μm |
| isolation well 32: | $1 \times 10^{17}/cm^3$-$1 \times 10^{18}/cm^3$ | 5 μm |
| HVNW 36: | $3 \times 10^{16}/cm^3$ | 1.0 μm |
| HVNW (p-) 38: | $1 \times 10^{16}/cm^3$ | 1.0 μm |
| drain 44: | $1 \times 10^{21}/cm^3$ | 1.0 μm |
| source 46: | $1 \times 10^{21}/cm^3$ | 0.25 μm |
| body 48: | $1 \times 10^{17}/cm^3$ | 3 μm |
| STI 64: | varies | 0.35 μm |

The concentrations and thicknesses may be different in other embodiments.

Figure 6:
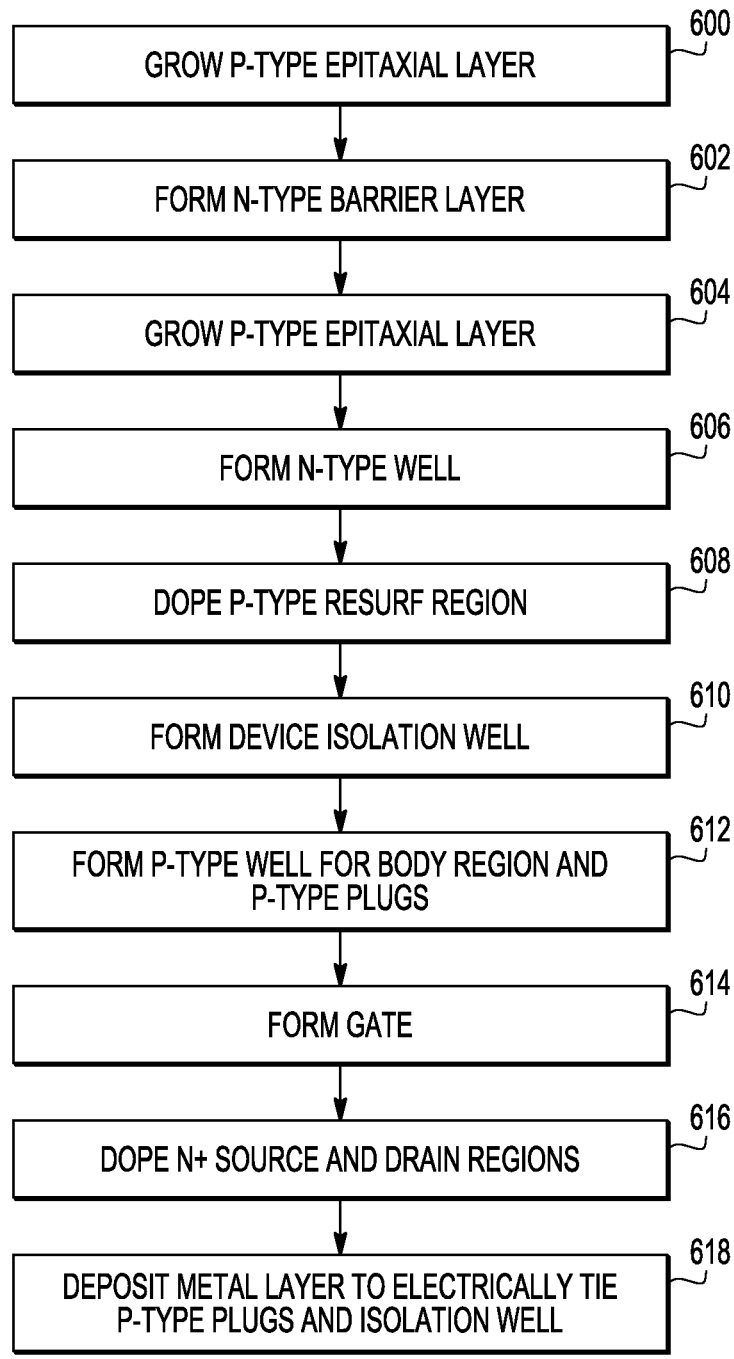
FIG. 6 is a flow diagram of an exemplary fabrication sequence to construct an n-channel field LDMOS transistor with self-biased isolation in accordance with one embodiment.

FIG. 6 shows an exemplary fabrication method for fabricating one or more of the above-described devices. The method may be directed to fabricating a reduced surface field (RESURF) transistor having one or more of the features described above. The transistor is fabricated with substrate, the regions or layers of which may have the conductivity types of the n-channel examples described above, or be alternatively configured to support a p-channel device. The method includes a sequence of acts, only the salient of which are depicted for convenience in illustration. The ordering of the acts may vary in other embodiments. The fabrication method is not limited to any particular doping mechanism, and may include future developed doping techniques.

The method may include an act 600 in which a p-type epitaxial layer is grown on a heavily doped p-type substrate. A barrier layer may then be formed in the epitaxial layer of the substrate in act 602. In one example, an ion implantation procedure may be implemented to form the barrier layer. The barrier layer may be configured via a mask to extend across an active area of the RESURF transistor. In this example, another p-type epitaxial layer may then be grown in an act 604 on the barrier layer. Alternatively, the barrier layer may be formed in the epitaxial layer grown in act 604. Any number of epitaxial layers may be grown. The method further includes an act 606 in which an n-type well is formed in the upper epitaxial layer. In one example, the act 606 is implemented via an ion implantation procedure. The well may be configured via another mask to provide a drift region of the device. A RESURF region of the well is then p-type doped in act 608 to have the opposite conductivity type of the well. The act 608 may include the implementation of yet another ion implantation procedure. The RESURF region may be disposed adjacent the barrier layer as described above.

Either before or after act 608, additional device wells are formed in acts 610 and 612 via respective ion implantation procedures, the order of which may also vary. In act 610, a device isolation well is formed in the substrate. In act 612, a p-type well is formed to create the device body. During the deposition, implantation, or other technique(s) for forming the p-type well, one or more p-type plugs are also formed to link the RESURF region to the surface of the substrate at or near the drain. Because the plug region(s) is formed while the well for the body is being formed, the device body and the plugs may thus reach the same or a similar depth in the substrate. The ion implantation procedure is configured to establish a dopant concentration in the regions of the plug(s) that overcomes the opposite dopant concentration previously implanted for the RESURF region. After formation of the plug(s), the gate of the device is formed in act 614. The source and drain regions may then be formed in act 616, using the gate for self-alignment and via an n-type ion implantation doping procedure. The plugs may be covered by a mask layer to block the source and drain implant. One or more metal layers may then be deposited in act 618 to, for instance, electrically tie or short the device isolation well to the plug region.

In an alternative embodiment, the above-described plug(s) may be formed via an ion implantation procedure devoted or directed solely to formation of the plug(s). Other device regions may be shielded from the ion implantation via a dedicated mask configured to define the plug region(s).

Semiconductor devices with a conductive gate electrode positioned over a dielectric or other insulator may be considered MOS devices, despite the lack of a metal gate electrode and an oxide gate insulator. Accordingly, the terms metal-oxide-semiconductor and the abbreviation "MOS" are used herein even though such devices may not employ metals or oxides but various combinations of conductive materials, e.g., metals, alloys, silicides, doped semiconductors, etc., instead of simple metals, and insulating materials other than oxides (e.g., nitrides, oxy-nitride mixtures, etc.). Thus, as used herein, the terms MOS and LDMOS are intended to include such variations.

The embodiments described above include devices and methods of fabricating devices configured for self-biased isolation to realize a higher breakdown voltage. The self-biased isolation is established via a structural arrangement in the devices that may provide a lower isolation bias voltage and an asymmetric double RESURF effect.

In a first aspect, a device includes a semiconductor substrate having a surface, a drain region in the semiconductor substrate having a first conductivity type, a well region in the semiconductor substrate on which the drain region is disposed, the well region having the first conductivity type, a buried isolation layer in the semiconductor substrate extending across the well region, the buried isolation layer having the first conductivity type, a reduced surface field (RESURF) region disposed between the well region and the buried isolation layer, the RESURF region having a second conductivity type, and a plug region in the semiconductor substrate extending from the surface of the substrate to the RESURF region, the plug region having the second conductivity type.

In a second aspect, an electronic apparatus includes a reduced surface field (RESURF) transistor, which, in turn, includes a first semiconductor region having a first conductivity type, a second semiconductor region having a second conductivity type and disposed above the first semiconductor region, a third semiconductor region having the first conductivity type and disposed above the second semiconductor region, a fourth semiconductor region having the first conductivity type and disposed above the third semiconductor region, and a fifth semiconductor region having the second conductivity type. The fifth semiconductor region extends through the third semiconductor region to reach the second semiconductor region, and is electrically tied to the first semiconductor region, to bias the first semiconductor region based on a voltage applied to the fourth semiconductor region.

In a third aspect, a method of fabricating a reduced surface field (RESURF) transistor includes forming a first well in a substrate, the first well having a first conductivity type, doping a RESURF region of the first well to have a second conductivity type, doping a portion of the first well to form a drain region of the RESURF transistor, the drain region having the second conductivity type, and forming a second well in the substrate, the second well having the second conductivity type. A plug region is formed in the substrate, the plug region extending to the RESURF region.

The present invention is defined by the following claims and their equivalents, and nothing in this section should be taken as a limitation on those claims. Further aspects and advantages of the invention are discussed above in conjunction with the preferred embodiments and may be later claimed independently or in combination.

While the invention has been described above by reference to various embodiments, it should be understood that many changes and modifications may be made without departing from the scope of the invention. It is therefore intended that the foregoing detailed description be regarded as illustrative rather than limiting, and that it be understood that it is the following claims, including all equivalents, that are intended to define the spirit and scope of this invention.

The invention claimed is:

1. A device comprising:
    a semiconductor substrate comprising a surface;
    a drain region in the semiconductor substrate having a first conductivity type;
    a well region in the semiconductor substrate on which the drain region is disposed, the well region having the first conductivity type;
    a buried isolation layer in the semiconductor substrate extending across the well region, the buried isolation layer having the first conductivity type;
    a reduced surface field (RESURF) region disposed between the well region and the buried isolation layer, the RESURF region having a second conductivity type; and
    a plug region in the semiconductor substrate extending from the surface of the substrate to the RESURF region, the plug region having the second conductivity type.

2. The device of claim 1, further comprising a device isolation well in the semiconductor substrate, wherein:
    the device isolation well has the first conductivity type;
    the buried isolation layer is coupled to the device isolation well; and
    the device isolation well is electrically tied to the plug region.

3. The device of claim 1, wherein the plug region comprises a plurality of plugs spaced from one another by respective portions of the drain region.

4. The device of claim 3, wherein each plug is sized and spaced from one or more adjacent plugs of the plurality of plugs to bias the plug region at a voltage that falls in a range from about 50% to about 80% of a voltage applied to the drain region.

5. The device of claim 1, wherein the plug region electrically links an upper surface of the substrate to an upper surface of the RESURF region.

6. The device of claim 1, wherein the well region is positioned in the semiconductor substrate as a drift region.

7. The device of claim 1, further comprising a body region in the semiconductor substrate and a source region disposed on the body region, wherein the body region has the second conductivity type and is spaced from the well region and the RESURF region.

8. The device of claim 1, wherein the first conductivity type is n-type and the second conductivity type is p-type.

9. The device of claim 1, wherein the semiconductor substrate comprises an epitaxial layer, and wherein the buried isolation layer is disposed in the epitaxial layer.

10. An electronic apparatus comprising:
    a reduced surface field (RESURF) transistor comprising:
        a first semiconductor region having a first conductivity type;
        a second semiconductor region having a second conductivity type and disposed above the first semiconductor region;
        a third semiconductor region having the first conductivity type and disposed above the second semiconductor region;
        a fourth semiconductor region having the first conductivity type and disposed above the third semiconductor region; and a fifth semiconductor region having the second conductivity type, wherein the fifth semiconductor region extends through the third semiconductor region to reach the second semiconductor region, and is electrically tied to the first semiconductor region, to bias the first semiconductor region based on a voltage applied to the fourth semiconductor region.

11. The electronic apparatus of claim 10, further comprising a device isolation well surrounding the RESURF transistor, wherein:
the device isolation well has the first conductivity type;
the first semiconductor region is coupled to the device isolation well; and
the first and fifth semiconductor regions are electrically tied via the device isolation well.

12. The electronic apparatus of claim 10, wherein the fifth semiconductor region comprises a plurality of plugs spaced from one another by respective portions of the fourth semiconductor region.

13. The electronic apparatus of claim 12, wherein each plug is sized and spaced from one or more adjacent plugs of the plurality of plugs to bias the first semiconductor region at a reduced voltage that falls in a range from about 50% to about 80% of the voltage applied to the fourth semiconductor region.

14. The electronic apparatus of claim 10, wherein the first semiconductor region and an upper surface of the second semiconductor region are electrically linked via the fifth semiconductor region.

15. The electronic apparatus of claim 10, wherein:
the first semiconductor region is configured as a barrier layer,
the third semiconductor region is positioned within the RESURF transistor as a drift region,
the fourth semiconductor region is configured as a drain region, and
the fifth semiconductor region is configured as a plug region.

16. The electronic apparatus of claim 10, wherein the first conductivity type is n-type and the second conductivity type is p-type.

* * * * *